(12) United States Patent
Suzuki

(10) Patent No.: US 6,826,050 B2
(45) Date of Patent: Nov. 30, 2004

(54) HEAT SINK AND ELECTRONIC DEVICE WITH HEAT SINK

(75) Inventor: Masumi Suzuki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/451,144

(22) PCT Filed: Dec. 20, 2000

(86) PCT No.: PCT/JP00/09374
§ 371 (c)(1),
(2), (4) Date: Jun. 27, 2003

(87) PCT Pub. No.: WO02/054490
PCT Pub. Date: Jul. 11, 2002

(65) Prior Publication Data
US 2004/0037036 A1 Feb. 26, 2004

(51) Int. Cl.[7] ............................................. H05K 7/20
(52) U.S. Cl. ................... 361/703; 361/709; 361/710; 257/722; 165/80.3; 165/185; 174/16.3
(58) Field of Search ................................ 361/697, 703, 361/704, 709, 710; 257/706, 712, 722; 174/16.3; 165/80.3

(56) References Cited

U.S. PATENT DOCUMENTS

| | | | | |
|---|---|---|---|---|
| 4,765,397 A | * | 8/1988 | Chrysler et al. | 165/104.33 |
| 5,787,976 A | * | 8/1998 | Hamburgen et al. | 165/185 |
| 5,860,472 A | * | 1/1999 | Batchelder | 165/185 |
| 5,957,194 A | * | 9/1999 | Azar | 165/80.3 |
| 6,067,227 A | * | 5/2000 | Katsui et al. | 361/695 |
| 6,324,061 B1 | * | 11/2001 | Kinoshita et al. | 361/709 |
| 6,394,175 B1 | * | 5/2002 | Chen et al. | 165/80.3 |
| 6,651,734 B1 | * | 11/2003 | Liu | 165/80.3 |
| 6,668,910 B2 | * | 12/2003 | Gawve | 165/80.3 |

FOREIGN PATENT DOCUMENTS

| | | |
|---|---|---|
| JP | 6-44147 | 6/1994 |
| JP | 7-105466 | 11/1995 |
| JP | 9-36284 | 2/1997 |
| JP | 2961976 | 8/1999 |
| JP | 2000-92819 | 3/2000 |
| JP | 3077575 | 6/2000 |
| JP | 2000-260916 | 9/2000 |

* cited by examiner

Primary Examiner—Boris Chérvinsky
(74) Attorney, Agent, or Firm—Westerman, Hattori, Daniels & Adrian, LLP

(57) ABSTRACT

A heat sink includes a heat receiving part for receiving heat from the outside, a first radiating part, connected to said heat receiving part, which forms a first air channel, and radiates the heat from said heat receiving part using air that passes through the first air channel, and a second radiating part, located apart from said heat receiving part and connected to said first radiating part, said second radiating part forming a second air channel which the air that has passed the first air channel enters, the second air channel being narrower than the first air channel, said second radiating part radiating the heat from said first radiating part.

16 Claims, 11 Drawing Sheets

PRIOR ART

PRIOR ART

HEAT SINK AND ELECTRONIC DEVICE WITH HEAT SINK

This application is a continuation based on PCT International Application No. PCT/JP00/09374, filed on Dec. 20, 2000, which is hereby incorporated by reference herein in its entirety as if fully set forth herein.

BACKGROUND OF THE INVENTION

The present invention relates generally to heat radiator mechanisms, and more particularly to a heat radiator mechanism for radiating the heat from an exoergic circuit element or exoergic component mounted in an electronic apparatus. The present invention is suitable, for example, for a heat sink that radiates the heat from various exoergic circuit elements on a printed board in a personal computer ("PC").

PCs are broadly available in the market as a typical information processor. A motherboard or main board in the PC is mounted with various circuit components such as a CPU socket, a variety of memory (sockets), a chipset, an expansion slot, and a BIOS ROM, and directly affects performance and functions of the PC.

Recent PCs tend to include an increased number of exoergic components and to generate more calorific values from them as various circuit components mounted on the motherboard provide higher speed and performance. The heat destabilizes operations of circuit components, and finally lowers the operational performance of a PC. Therefore, the PC provides the motherboard with a heat radiator mechanism called a heat sink in order to thermally protect the exoergic components and other circuit components mounted directly or via a socket or the like on the motherboard.

A description will be given of a conventional typical heat sink 500 with reference to FIGS. 18 and 19, and another conventional heat sink 600 with reference to FIGS. 20 and 21. Here, FIGS. 18 and 19 are schematic side and plane views of the heat sink 500. FIGS. 20 and 21 are schematic side and plane views of the heat sink 600. The heat sink typically includes plural cooling or radiating fins (or sometimes called "fin assembly") made of a material having high heat conductivity, and cools exoergic components by forced or spontaneous air cooling. The heat sink 500 includes a base 510 placed on an exoergic component (not shown) mounted on a motherboard (not shown), and a radiating part 520 that includes plural parallel plate-shaped fins 522 that extend from the base 510 perpendicular to the motherboard or in a direction Z in FIG. 18. The head sink 600 includes a base 610 placed on an exoergic component (not shown) mounted on a motherboard (not shown), and a radiating part 620 that includes plural pinholder-shaped fins 522 that extend from the base 610 perpendicular to the motherboard or in a direction Z in FIG. 20.

A fan-cum-heat sink that includes a fan has been proposed to enhance a cooling effect of the heat sink. The fan-cum-heat sink provides forced-air cooling to the heat sink with air currents produced by a fan.

A higher speed and more functions of various circuit elements have drastically increased the calorific values from the circuit elements, and required the heat sink to have higher heat radiation performance. Conceivably, this request would be met by increasing surface areas of the radiating parts 520 and 620 in the conventional heat sinks 500 and 600.

A conceivable way of increasing the surface area of the radiating part 520 or 620 is to narrow an interval or pitch between fins 522 or 622 and increase the number of fins 522 or 622 per unit area and/or to thicken each fin 522 or 622. Both of these methods eventually narrow a pitch, and reduce the air convection that passes between the fins 522 or 622, lowering the cooling efficiency at center parts of the bases 510 and 610 (this condition is sometimes called "increased pressure loss" in this application).

It is also conceivable to extend the height of the fins 522 or 622 in the height direction or direction Z to increase the surface area of the radiating part 520 or 620. However, the fin 522 or 622 has such a temperature gradient in the direction Z that the excessively high fin 522 or 622 has lowered heat exchanger effectiveness and cooling efficiency on its top. In order to rectify this shortcoming, it is also conceivable to replace a material of the fin 522 or 622 with a material having high heat conductivity for the reduced temperature gradient in the height direction or the direction Z. For example, it is conceivable to replace aluminum, typically used for the fins 522 and pins 622, which has heat conductivity of 203 W/m·K with copper that has heat conductivity of 372 W/m·K. However, copper needs antioxidant coating, and complexes the manufacture process. In addition, copper is heavier than aluminum and an undesirable material to be attached to a top of the component. The length in the direction Z is restricted by the mounting space limitation in the PC.

It is also conceivable to attach a fan to a heat sink to enhance the heat conductivity, but this deteriorates energy saving aspect and economical efficiency of the heat sink.

Thus, some parameters should be considered which include the pressure loss instead of merely increasing the surface area of the fin in order to enhance the heat radiation efficiency in a heat sink.

BRIEF SUMMARY OF THE INVENTION

Accordingly, it is a general object of the present invention to provide a novel and useful heat radiator mechanism and electronic apparatus having the same in which the above disadvantages are eliminated.

Another exemplified and more specific object of the present invention is to provide a heat radiator mechanism and electronic apparatus having the same, which comparatively inexpensively enhance the entire heat radiation efficiency taking into account some parameters including pressure loss.

A heat sink of one embodiment according to the present invention includes a heat receiving part for receiving heat from the outside, a first radiating part, connected to the heat receiving part, which forms a first air channel, and radiates the heat from the heat receiving part using air that passes through the first air channel, and a second radiating part, located apart from the heat receiving part and connected to the first radiating part, the second radiating part forming a second air channel which the air that has passed the first air channel enters, the second air channel being narrower than the first air channel, the second radiating part radiating the heat from the first radiating part. This heat sink may radiate the heat from the heat receiving part using the first and second radiating parts. The first radiating part forms the first air channel, and radiates the heat as a result of that the air passes through the first air channel. The air that has passed through the first air channel may enter the second air channel of the second radiating part narrower than the first air channel, and the second radiating part may radiate the heat using the air convection. The second radiating part is spaced from the first radiating part by a predetermined distance that contributes to definition of the first air channel at the first radiating part. The first radiating part of the heat sink includes, for example, plural fins, and the second radiating part is provided between two fins, thereby maintaining the second air channel. The sufficiently large second air channel may be maintained by providing the second radiating part with second fin thinner than the first fin. Moreover, this heat sink forms a surface area of the second radiating part larger than that of the first radiating part, maintains the sufficiently wide heat radiation area and enhances the heat radiation effect. The heat sink includes a side plate that encloses the second radiating part and defines an air channel, so as to assist the second radiating part in radiating the heat. The second radiating part includes a first part near a center, and a second part, located outside the first part, which has a larger surface area than the first part. A wide heat radiation area may be obtained by forming the first part larger than the second part that promotes the air convection. A similar operation may be obtained by making the second part longer than the first part in the height direction. Alternatively, the first part longer than the second part in the height direction would promote the air convection at the first part and enhance the heat radiation efficiency. The convection at the second radiating part may be promoted and the heat radiation efficiency may be promoted by forming a notch in the thin plate, and raising the notch to form a raised piece as a bent projection and disturb the airflow. This notch may connect adjacent second air channels. The increased number of pillar parts and a shape of the pillar part would promote the air convection and enhance the heat radiation efficiency.

An electronic apparatus of another embodiment according to the present invention includes a printed board mounted with an exoergic component, and a heat sink, provided on the printed board, which cools the exoergic component, wherein the heat sink includes a heat receiving part for receiving heat from the outside, a first radiating part, connected to the heat receiving part, which forms a first air channel, and radiates the heat from the heat receiving part using air that passes through the first air channel, and a second radiating part, located apart from the heat receiving part and connected to the first radiating part, the second radiating part forming a second air channel which the air that has passed the first air channel enters, the second air channel being narrower than the first air channel, the second radiating part radiating the heat from the first radiating part. This electronic apparatus has the above heat sink, and exhibits similar operations to those of the heat sink.

Other objects and further features of the present invention will become readily apparent from the following description of the embodiments with reference to accompanying drawings.

DETAILED DESCRIPTION OF THE INVENTION

Figure 1:
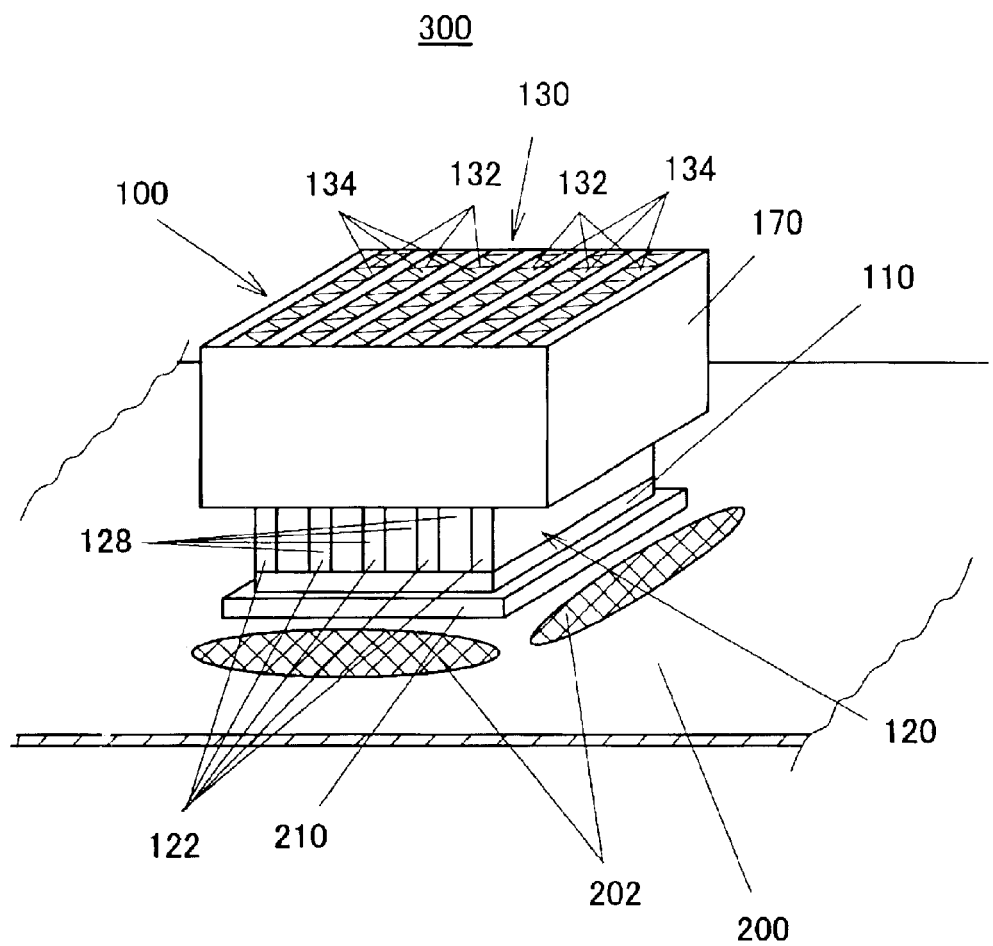
FIG. 1 is a schematic perspective view near a heat sink as one embodiment according to the present invention that is applied to a motherboard in a PC.
Figure 2:
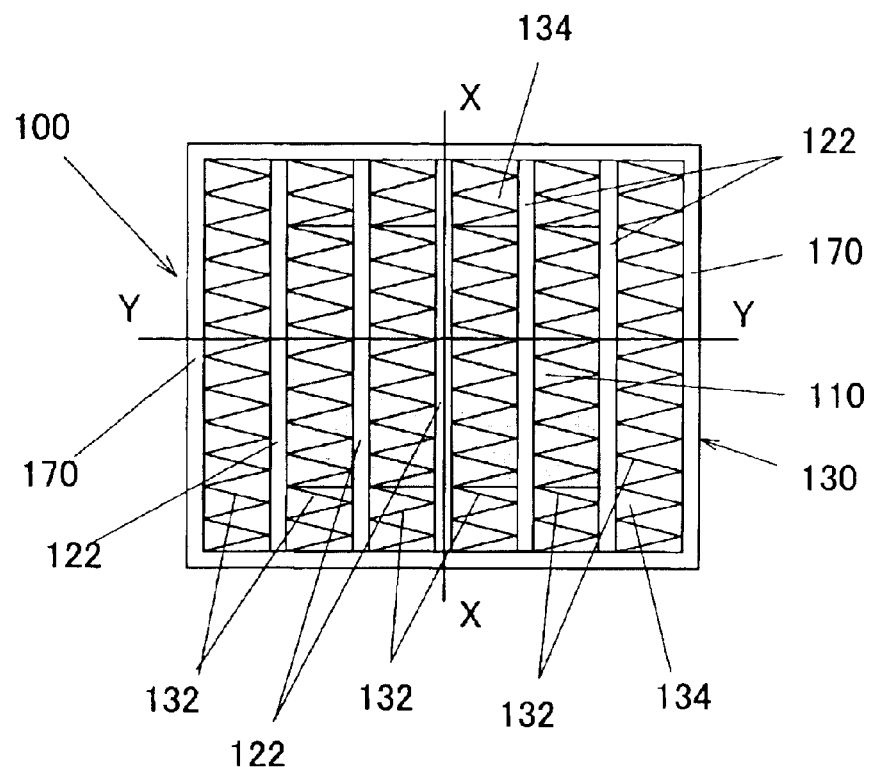
FIG. 2 is a schematic top view of the heat sink shown in FIG. 1.
Figure 3:
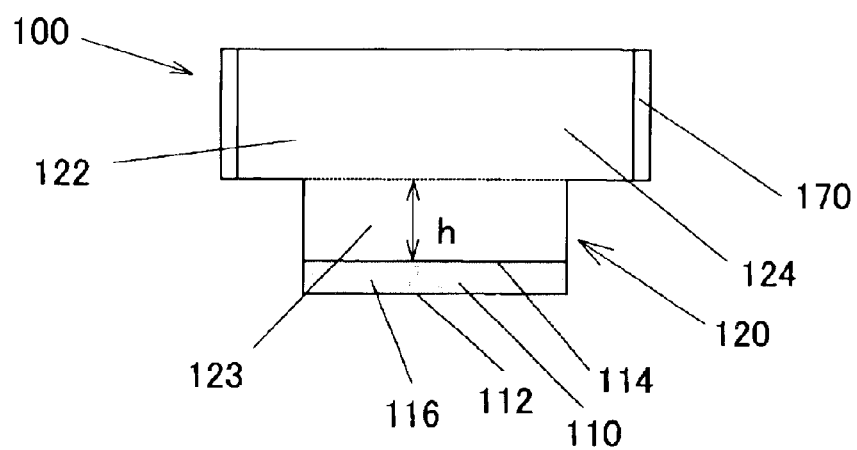
FIG. 3 is a schematic sectional view of the heat sink shown in FIG. 2 taken along line X—X.
Figure 4:
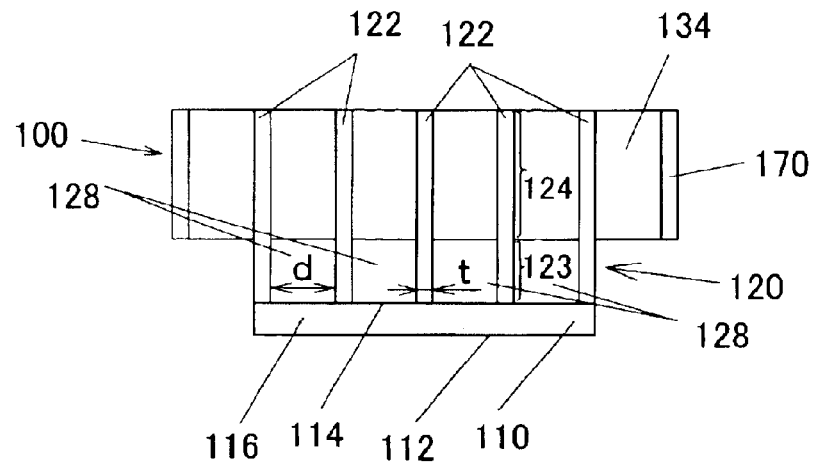
FIG. 4 is a schematic sectional view of the heat sink shown in FIG. 2 taken along line Y—Y.

A description will now be given of a heat sink as a radiator mechanism of one embodiment according to the present invention, with reference to FIGS. 1 to 4. FIG. 1 is a schematic perspective view near a heat sink 100 as one embodiment according to the present invention that is applied to a motherboard 200 in a PC 300. FIG. 2 is a schematic top view of the heat sink 100. FIG. 3 is a schematic sectional view of the heat sink 100 shown in FIG. 2 taken along line X—X. FIG. 4 is a schematic sectional view of the heat sink 100 shown in FIG. 2 taken along line Y—Y. The same element in each figure is designated by the same reference numeral, and a duplicate description thereof will be omitted. The reference numeral with an alphabet generally denotes a variation, and the reference numeral without an alphabet generalizes all the same reference numerals with different alphabets.

The heat sink 100 is placed on a CPU 210 (which includes an MPU and any other processor irrespective of its name) as an exoergic component mounted on the motherboard 200 shown in FIG. 1. The heat sink 100 includes a heat receiving part 110, a pillar part 120, a radiating part 130, and side plate 170.

The heat receiving part 110 thermally contacts an exoergic component outside the heat sink 100 and receives heat from it. The instant embodiment places the heat receiving part 110 directly on the CPU 210, but the present invention allows the heat receiving part 110 to indirectly contact the CPU 210 via a certain member. The heat receiving part 110 has a rectangular plate shape in the instant embodiment, but may have an arbitrary shape according to shapes of exoergic components to be connected to the heat receiving part 110. The heat receiving part 110 has a bottom area surface (e.g., 40 mm×40 mm) that is approximately the same as or larger than the top surface area of the CPU 210 so that it may receive heat from the entire surface of the CPU 210. The thickness of the heat receiving part 110 is not limited, but the heat receiving part 110 preferably is made as thin as possible for effective heat conduction to the pillar 120, which will be described later. The heat receiving part 110 is made, for example, of such a material having high thermal conductivity as aluminum.

The heat receiving part 110 has a heat receiving surface 112 as a surface that surface-contacts the CPU 210, a heat radiator surface 114 as a surface opposite to the heat receiving surface 112 and at the side of the pillar 120, and four side surfaces 116. The inventive heat sink 100 absorbs the heat generated from the CPU 210 through the heat generating surface 112, and transfers the heat to the pillar part 120 at the heat radiator surface 114. Of course, the heat receiving part 110 may radiate the heat at the heat radiator surface 114 and side surfaces 116. The heat receiving part 110 may be formed integral with the pillar part 120, or formed independent of the pillar part 120 and then jointed together.

The pillar part 120 serves as a first heat radiator part that radiates the heat from the heat receiving part 110, and conducts part of the heat received from the heat receiving part 110 to the heat radiator part 130. The pillar part 120 of the instant embodiment is made of plural approximately T-shaped plate-shaped fins 122 which are arranged in parallel. However, as described below with reference to FIG. 8, the inventive plate-shaped fins 122 do not have to be necessarily arranged in parallel. As described below with reference to FIG. 5, the present invention does not limit the shape of the pillar part 120 to a plate shape, and may use the pillar part 120 with a pin shape or any other shape.

The pillar fins 122 stand erect from the heat radiator surface 114, and a vent 128 shown in FIG. 1 is connected between two fins 122. The vent 128 is connected to the outside, and maintains, with two fins 122, a first air channel for cooling. The first air channel contributes to air cooling to the heat radiator surface 114, fins 122, and heat radiator part 130, which will be described later.

Referring to FIG. 3, the plate-shaped fin 122 of this embodiment has an approximately T-shape, and includes a lower part 123 (below a dotted line in FIG. 3) formed as wide as the heat receiving part 110, and an upper part 124 (above the dotted line in FIG. 3) connected to the heat radiator part 130 and formed wider than the lower part 123. The lower part 123 has a height h, for example, of about 7 mm. The height h of zero would eliminate the vents 128, and undesirably enlarge the pressure loss. The height h having a value near zero would reduce the vents 128, and undesirably enlarge the pressure loss. The height h differs depending upon use or nonuse of a fan, even when the same heat radiator effect is expected. As will be described later, the heat radiator part 130 is spaced from the heat receiving part 110 by the height h. As detailed later, as shown in FIG. 2, the instant embodiment forms the upper part 124 and the heat radiator part 130 larger than the top surface of the heat receiving part 110. Therefore, when the height h becomes zero, the upper part 124 and heat radiator part 130 undesirably prevent a memory and other circuit elements from being mounted in a space 202 shown in FIG. 1 adjacent t the CPU 210 on the motherboard 200. Therefore, the height h of about 5 mm or larger, more preferably 7 to 10 mm, is necessary even when the fan is used.

The upper part 124 of the pillar part 120 is wider (e.g., about 60 mm) than the lower part 123, and maintains a wide heat radiator area. A shape of the plate-shaped fin 122 of this embodiment is exemplary for this advantage, and the present invention may use a trapezoid-shaped plate-shaped fin.

As shown in FIGS. 1 and 4, the pillar part 120 of the instant embodiment is made of five plate-shaped fins 122. The number of plate-shaped fins 122 is exemplary, and the present invention is not limited to this number. An interval d between adjacent plate-shaped fins 122 defines the above first air channel to the heat radiator part 130. As the airflow is in proportion to product between the height h and the interval d, the interval d is determined for the intended airflow. The interval d is set to, for example, about 7 to 11 mm, and 9 mm in the instant embodiment. As shown in FIG. 4, each plate-shaped fin 122 has the same size and shape with a common thickness t in the instant embodiment. As the thickness t increases, the surface area of the fin 122 generally increases, narrowing the interval d. The excessively small thickness t would enlarge the temperature gradient to the tip (or top in FIG. 4) of the pillar part 120, and lower the heat conduction performance and thus the heat conductivity from the pillar part 120 to the heat radiator part 130. The thickness t was set in view of this point. The thickness t is set, for example, about 1 to 2 mm, and about 2 mm in the instant embodiment.

The pillar part 120 is made, for example, of such a material having high thermal conductivity as aluminum. As discussed above, the pillar part 120 may be formed integral with the heat receiving part 110. When the pillar part 120 is formed as a single member, the pillar part 120 is provided on the side of the heat receiving surface 114 of the heat receiving part 110 through such means as adhesion and welding.

Figure 5:
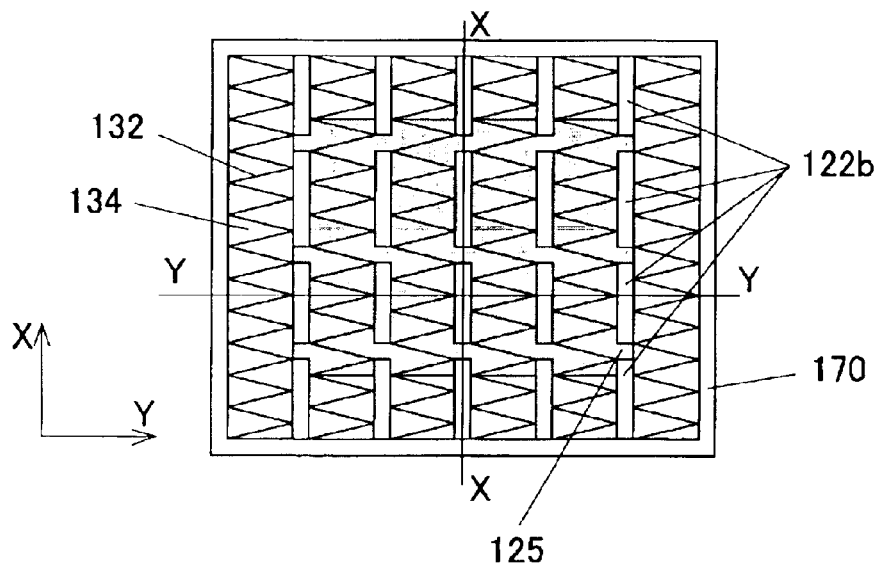
FIG. 5 is a schematic top view of the heat sink having a plate-shaped fin as a variation of a pillar part shown in FIG. 1.
Figure 6:
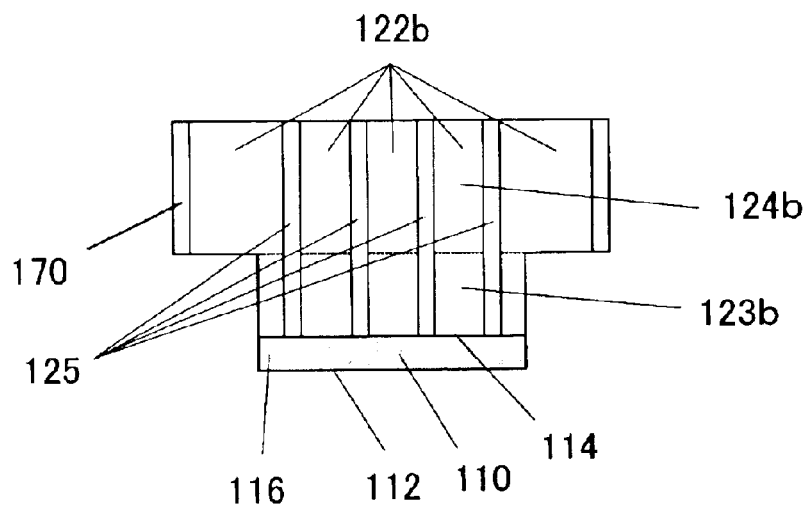
FIG. 6 is a schematic sectional view of the heat sink shown in FIG. 5 taken along line X—X.
Figure 7:
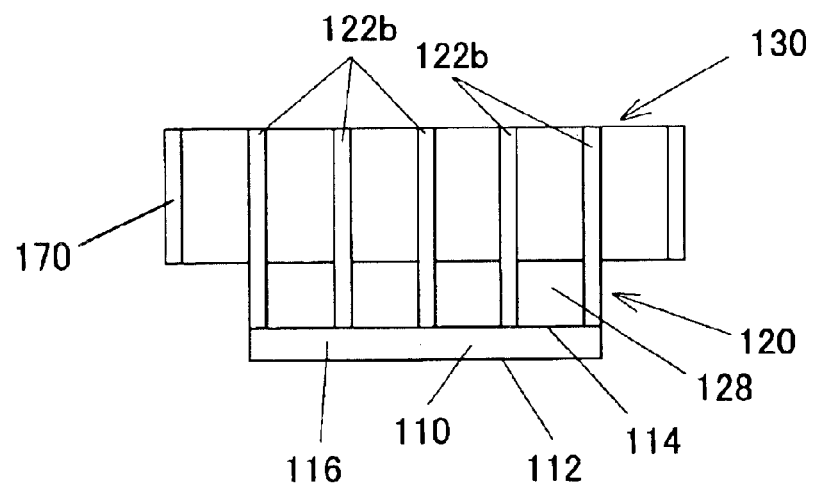
FIG. 7 is a schematic sectional view of the heat sink shown in FIG. 5 taken along line Y—Y.

As discussed above, the pillar part 120 is not limited to the above T shape, and may include a plate-shaped fin 122, as shown in FIGS. 5 to 7, which divides one plate-shaped fin 122 into plural pieces using slits 125. Here, FIG. 5 is a schematic top view of the heat sink 100 having a plate-shaped fin 122b as a variation of a pillar part 120 shown in FIG. 1. FIG. 6 is a schematic sectional view of the heat sink 100 shown in FIG. 5 taken along line X—X. FIG. 7 is a schematic sectional view of the heat sink 100 shown in FIG. 5 taken along line Y—Y.

The slit 125 between adjacent plate-shaped fins 122b in the direction X in FIG. 5 may be connected to the above vents 128 by dividing the plate-shaped fin 122 into plural pieces, enlarging a range of the airflow. This shape promotes the air convection and may improve the heat radiation efficiency of the heat sink 100. The plate-shaped fin 122b may be provided with the slits 125 only at the upper part 124b so as not to reduce the heat conductivity to the radiating part 130 at the upper part 124 above the pillar part 120, or may be provided with the slits 125 to middle part between the upper and lower parts 124 and 123b. Understandably, similar operations and effects are available by providing the fin 122 with a notch or any other hole instead of the slit 125 and connecting the notch etc. to the above vents 128.

Figure 8:
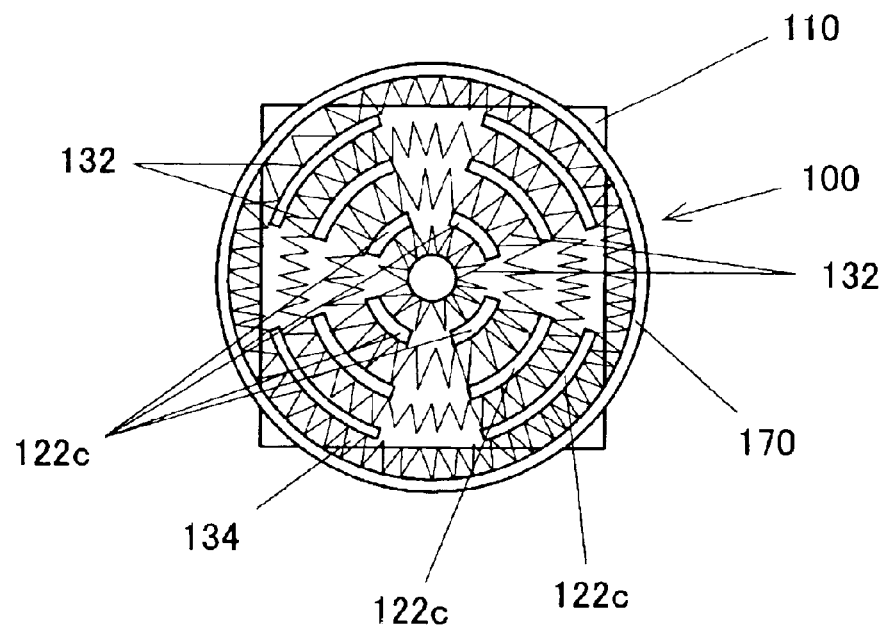
FIG. 8 is a schematic top view of the heat sink having a plate-shaped fin as a variation of a pillar part shown in FIG. 1.

As discussed above, the arrangement of the plate-shaped fin 122 of the pillar part 120 is not limited to a parallel and lateral arrangement. For example, as shown in FIG. 8, plural arc-shaped fins 122c may be arranged concentrically. Here, FIG. 8 is a schematic top view of the heat sink 100 having a plate-shaped fin 122c as another variation of the pillar part 120 shown in FIG. 1. This arrangement may also exhibit similar operations of the plate-shaped fin 122 having the above structure.

The radiating part 130 is located at the upper part 124 of the pillar part 120, and serves as a second radiating part that radiates the heat from the pillar part 120. The radiating part 130 has a thin plate 132. The instant embodiment provides the radiating part 130 between the fins 122, but the radiating part 130 does not have to be provided between fins 122, and may be provided onto the lower part 123 by removing the upper part 124. As shown in FIGS. 2 and 4, the radiating part 130 respectively arranges thin plates 132 orthogonal to the heat receiving part 110 between the plate-shaped fins 122. The radiating part 130 uses the thin plate 132 to radiate the heat absorbed from the heat receiving part 110 and transmitted to the pillar part 120.

The thin plate 132 has a plate thickness smaller than the thickness t (which is 0.2 mm in this embodiment) of the plate-shaped fin 122 of the pillar 120, and its section is bent like a corrugated shape. Of course, the thin plate 132 may have various sectional shapes, such as any other waveform shape, a U-shape, a V-shape, and a W-shape. As the thin plate 132 intends to enlarge the surface area of the pillar part 120, the present invention covers a non-bent shape, for example a diagonally provision between two adjacent pillar parts 120's upper parts 124.

As shown in FIG. 2, the thin plate 132 forms bent portions so that they may contact the plate-shaped fin 122, and defines a second air channel in an airflow direction from the lower part 123 of the plate-shaped fin 122 to the upper part 124 (or from the upper part 124 to the lower part 123). The thin plate 132 has the approximately the same size as the upper part 124 of the plate-shaped fin 122. Such a corrugated bending interval is applied to the thin plate 132 so as not to prevent the airflow at the radiating part 130. As shown in FIG. 2, the passages 134 as the second air channel defined by the thin plate 132 are connected to the above vents 128.

The thin plate 132 radiates the heat conducted by the thin plate 132 via a contact portions with the plate-shaped fin 122. The corrugated thin plate 132 may maintain a large surface area. In other words, the thin plate 132 expands the heat radiation area between the plate-shaped fins 122. The thin plates 132 maintain larger heat radiation area and do not reduce the heat radiation efficiency of the heat sink 100 even when the plate-shaped fins 122 of the pillar part 120 have such a wide fin pitch as allows the uniform air convection. The thin plate 132 is thinner than the plate-shaped fin 122, and does not prevent the air natural convection.

The thin plate 132 is made, for example, of such a material having high thermal conductivity as aluminum. The thin plate 132 is so thin that its weight would not be problematic, and thus may use another material having high thermal conductivity, such as copper, to enhance the heat radiation efficiency. When the thin plate 132 is made of aluminum, the thickness of the thin plate 132 is between 0.1 and 0.3 mm. When the thin plate 132 is made of copper, the thickness of the thin plate 132 is between 0.05 and 0.15 mm, about half that for aluminum.

Figure 9:
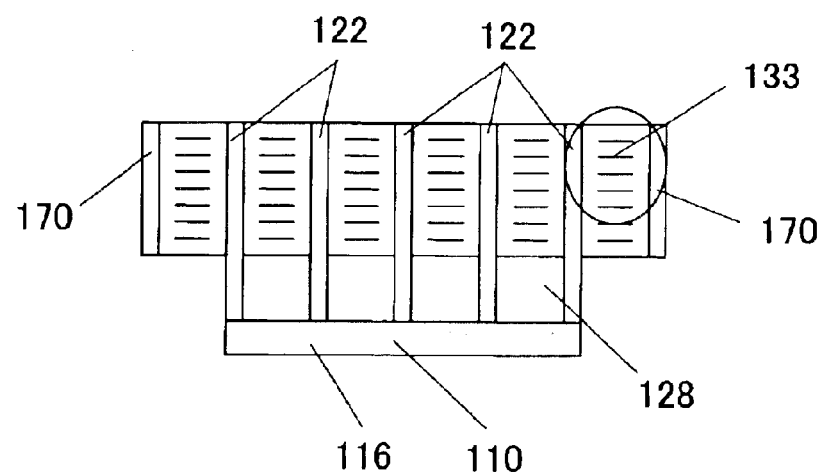
FIG. 9 is a schematic sectional view of a variation of a thin plate of a radiating part in the heat sink shown in FIG. 1.
Figure 10:
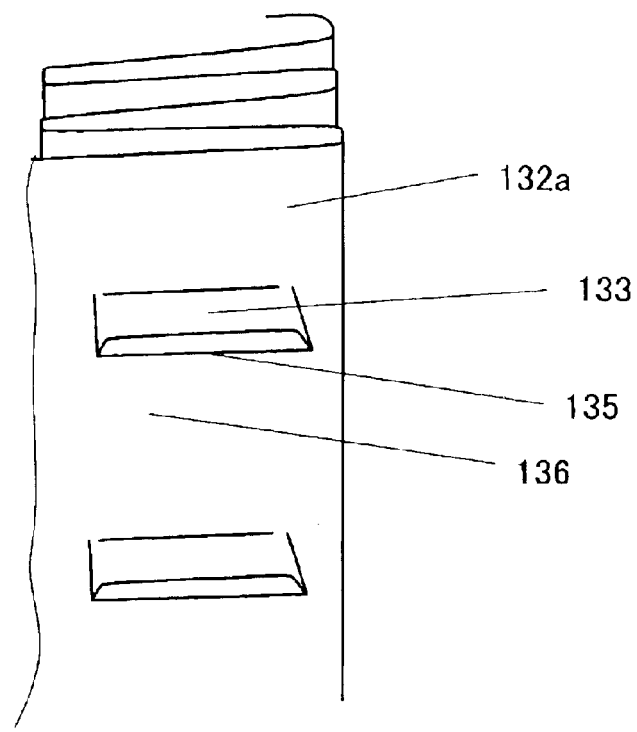
FIG. 10 is an enlarged perspective view of a circle shown in FIG. 9.

Referring to FIGS. 9 and 10, the thin plate 132 may be replaced with a thin plate 132a that has a plurality of raised pieces 133. FIG. 9 is a schematic sectional view of the thin plate 132a as a variation of the thin plate 132. FIG. 10 is an enlarged perspective view of a circle shown in FIG. 9. The raised piece 133 is provided on a plane area 136 of the thin plate 132a, which is not subject to bending. The raised piece 133 is formed by forming a notch 135 in the plane area 136 of the thin plate 132a, raising a top of the notch 135, and deforming the plane area 136. Each plane area 136 may form a plurality of raised pieces 133. The raised pieces 133 are preferably formed on each plane area 136 of the thin plate 132a. The thin plate 132a uses the raised pieces 133 to disturb airflow that convects on the thin plate 132, and thus promotes turbulence and enhances the heat conductivity. Therefore, the raised pieces 133 promote the air convection on the thin plate 132a, and assist in enhancing the heat radiation efficiency. The thin plate 132 may exhibit this operation by forming a projection on its surface, and thus is not limited to the above embodiment.

The raised pieces 133 on the thin plate 132a have an effect to introduce the air that convects on the thin plate 132a into the notch 135. In other words, the airflow may be expanded simply by providing a perforation in the thin plate 132. The air introduced through the vents 128 ascends vertical to the heat receiving part 110, and the raised pieces 133 in the instant embodiment assist the air in passing through the notch 135. Therefore, the raised pieces 133 also promote the air convection on the thin plate 132a, and enhance the heat radiation efficiency.

The side plate 170 is a frame that encloses the plate-shaped fins 122 and the thin plate 132 located at the outermost plate-shaped fin 122, as best shown in FIGS. 2 to 4. The side plate 170 is formed with approximately the same thickness as the plate-shaped fin 122. The side plate 170 has a shape by adhering four plates, or a hollow square pole. A provision of the side plate 170 would be able to prevent leakage of wind from the outermost thin plates 132. In other words, the side plate 170 maintains the air channel, and controls the airflow at the radiating part 130 (in particular, near the thin plate 132 located at the outermost part). This side plate 170 is especially effective when the heat sink 100 is provided with a fan (not shown). The side plate 170 may radiate the heat conducted from the pillar part 120 and the thin plate 132 due to the heat conduction associated with the air convection.

Figure 11:
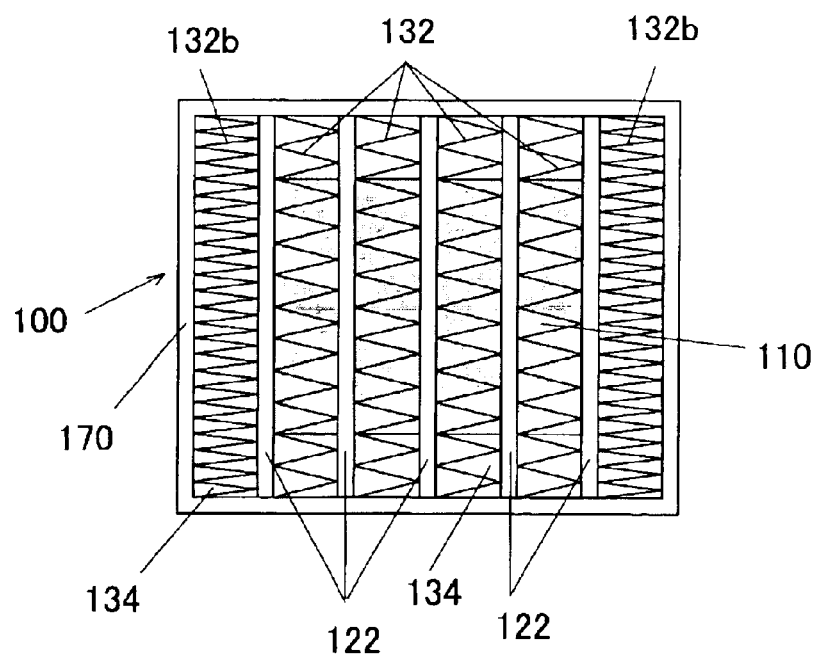
FIG. 11 is a schematic perspective top view of a heat sink having a thin plate as a variation of a thin plate shown in FIG. 1.

The air convection is promoted at the side of the thin plate 132 located at both ends compared with the center part of the radiating part 130. Therefore, as shown in FIG. 11, the outermost thin plates 132 of the plate-shaped fin 122 may be replaced with a thin plate 132b shown in FIG. 11. Here, FIG. 11 is a schematic perspective top view of a heat sink 100 having the thin plate 132b as another variation of the thin plate 132 shown in FIG. 1. The thin plate 132b is bent so that an interval smaller than the thin plate 132 between the plate-shaped fins 122. The thin plate 132b has a surface area larger than that of the thin plate 132, and thus expands the heat radiation area effectively. As discussed above, since the air convection is promoted at the side of the thin plates 132b located at both ends, a narrow interval of the thin plate 132b does not weaken the air convection.

Figure 12:
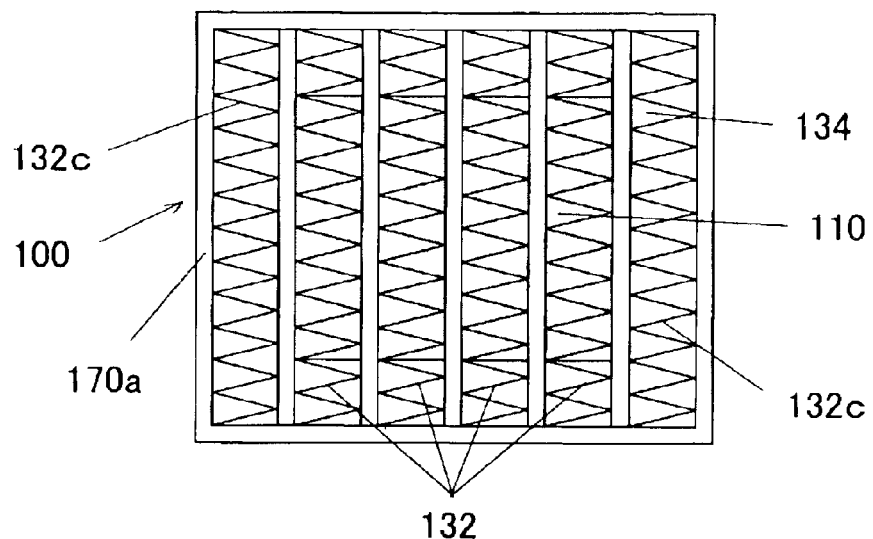
FIG. 12 is a schematic plane view of a variation of a side plate of the heat sink shown in FIG. 1.
Figure 13:
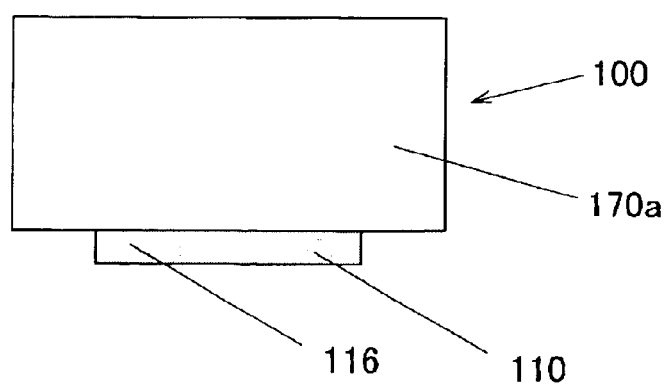
FIG. 13 is one schematic side view of the heat sink shown in FIG. 12.
Figure 14:
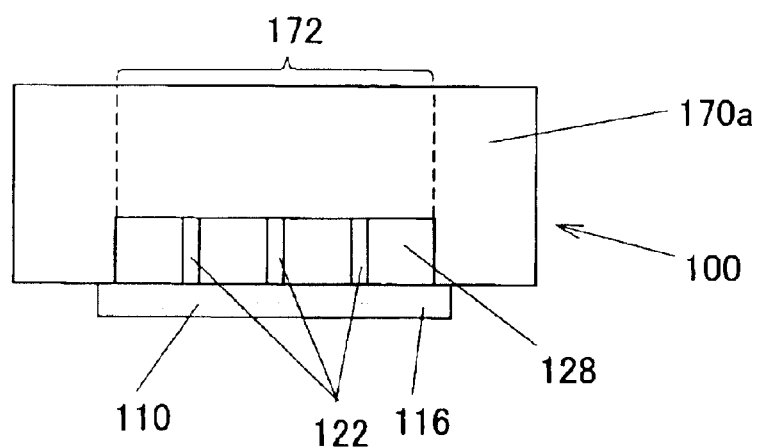
FIG. 14 is another schematic side view of the heat sink shown in FIG. 12.

The heat radiator part 130 may replace the side plate 170 with a side plate 17a shown in FIGS. 12 to 14. Here, FIG. 12 is a schematic plane view of the heat sink 100 having the side plate 170a as a variation of the side plate 170 shown in FIG. 1. FIG. 13 is one schematic side view of the heat sink 100 shown in FIG. 12. FIG. 14 is another schematic side view of the heat sink 100 shown in FIG. 12. The side plate 170a is formed higher than the side plate 170, and as high as the plate-shaped fin 122. Therefore, the side plate 170 encloses the pillar part 120 entirely. However, the side plate 170a at the side orthogonal to the plate-shaped fin 122 is formed as high as the side plate 170 at a portion 172 corresponding to the pillar part 120 so as not to prevent the air inflow to or near the center of the heat sink 100. In this state, the outermost thin plate 132c of the pillar part 120 is longer than the thin plate 132 between the plate-shaped fins 122. More specifically, the thin plate 132c is as high as the side plate 170a. The thin plate 132c may be formed higher than the thin plate 132 by elongating the side plate 170a, and the surface area of the radiating part 130 may be expanded further. As discussed, since the air convection is promoted at the side of the thin plate 132c located at both ends, the long side plate 170 and thin plate 132 do not weaken the air convection near the thin plate 132c.

Figure 15:
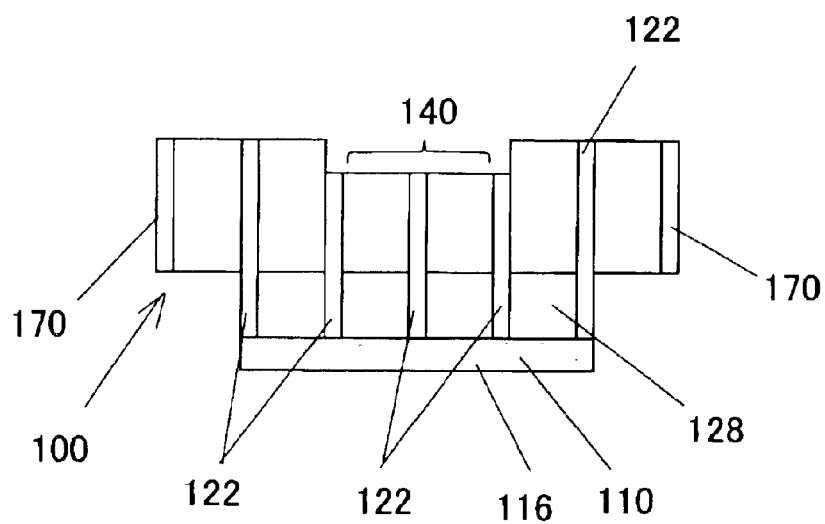
FIG. 15 is a schematic sectional view of the heat sink shown in FIG. 1 provided with a cavity.
Figure 16:
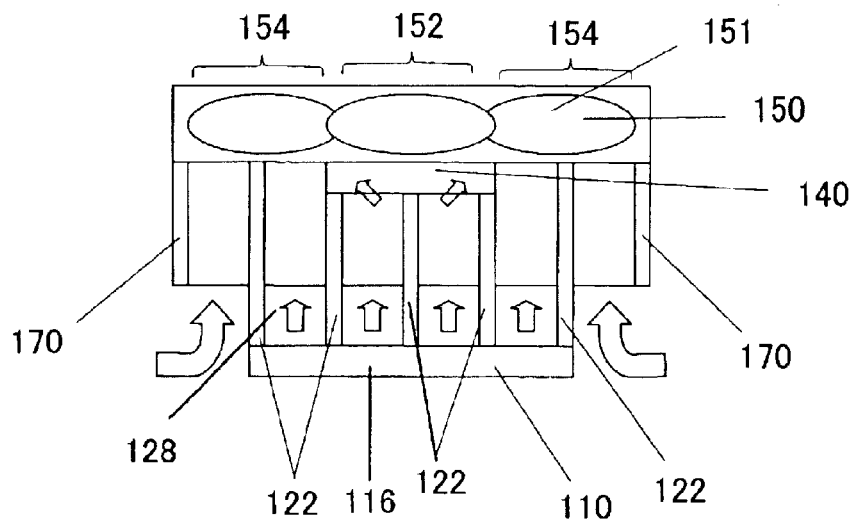
FIG. 16 is a schematic sectional view of the heat sink shown in FIG. 15 provided with a fan.

On the other hand, referring to FIG. 15, the heat sink 100 may have a cavity 140 different from the shape shown in FIGS. 11 to 14. Here, FIG. 15 is a schematic sectional view of the heat sink 100 shown in FIG. 1 provided with the cavity 140. The cavity 140 is a shape convex cavity projecting down at the side opposite to the heat receiving part 110 near the center part of the radiating part 130 and the pillar part 120. A provision of this cavity 140 would shorten the radiating part 130 near the center part. Therefore, the air convection is promoted near the center part of the radiating part 130 and provides the enhanced heat radiation efficiency when compared with a structure without the cavity 140. Referring to FIG. 16, this shape is effective when the fan 150 is provided 150. FIG. 16 is a schematic sectional view of the heat sink 100 shown in FIG. 15 provided with a fan 150. When the top of the heat sink 100 is provided with the fan 150, the fan center part 152 is such a center of rotation of the fan 150, and causes less air convection. However, a provision of the cavity 140 would be able to introduce the air from a fan end 154, and improve the heat radiation efficiency of the radiating part 130 (especially at the center part). The fan 150 is also called a cooler, and protects the CPU 210 from the heat by compulsorily radiating the heat. A lid is preferably provided to reduce noises associated with a rotation of the fan 150.

The fin 122 and the radiating part 130 are compulsorily cooled by rotating the fan 150 and generating the airflow. The fan 150 includes a motor portion (not shown), a propeller portion 151 fastened to the motor portion. The motor portion typically includes an axis of rotation, a bearing provided around the axis of rotation, a bearing house, and a magnet making up a motor, but since any structure known in the art may be applied to the motor portion 132, a detailed description will be omitted. In order to prevent heat transfer to the bearing house, a thermal insulation portion is preferably formed on an inner wall surface of the bearing house. The thermal insulating portion is, for example, formed of such a material having low thermal conductivity as fluoroplastic and silicon resin thin films.

The propeller portion 151 includes a desired number of rotor blades each forming a desired angle. The rotor blades may be so oriented to form equal or unequal angles, and have a desired dimension. The motor portion and propeller portion 151 in the fan 150 may be separable or non-separable. An illustration of wiring connected with the fan 150 is omitted. When a perforation or intake is formed in the space 202 shown in FIG. 1, the fan 150 may take in air from the both sides of the motherboard 200 through the perforation.

As discussed above, the heat sink 100 includes three parts, i.e., the heat receiving part 110, pillar part 120, and radiating part 130, enlarges the heat radiation area without disturbing the air convection, and improves the heat radiation efficiency. In this embodiment, the plate-shaped fin 122 of the pillar part 120 integrates the upper part 124 with the lower part 123, although the upper part 124 may be detachable from the lower part 123 in the plate-shaped fin 122 and only the lower part 123 constructs the pillar part 120. In other words, the radiating part 130 includes the upper part 124 of the plate-shaped fin 122 and the thin plate 132. The radiating part 130 in this structure may properly vary its size and shape in accordance with the intended heat radiation performance. Of course, this state maintains the heat transferable from the pillar part 120 to the radiating part 130. In use, the pillar part 120 is adhered to the radiating part 130.

Figure 17:
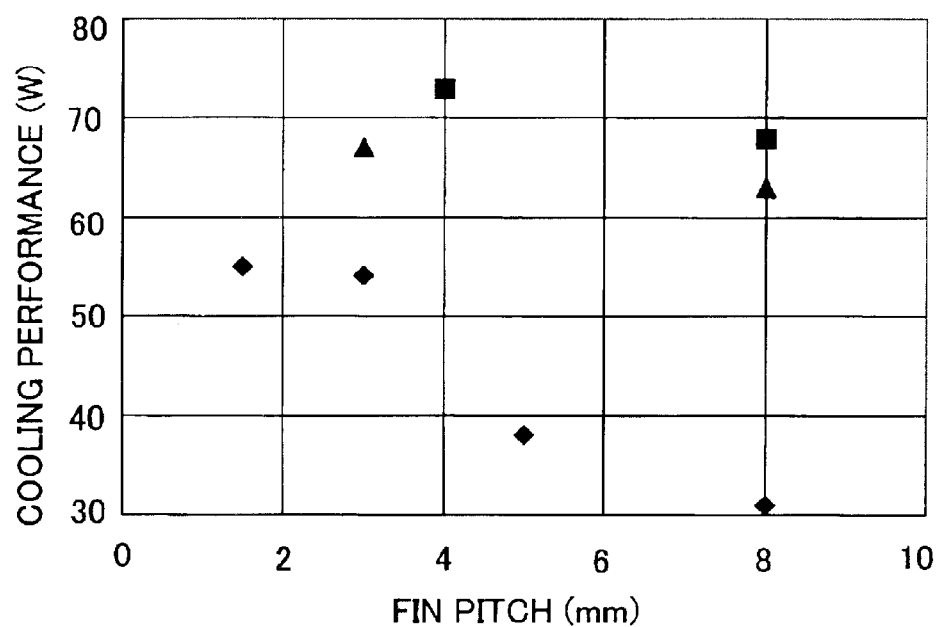
FIG. 17 is a view that compares cooling performance of a conventional heat sink with that of the inventive heat sink.
Figure 18:
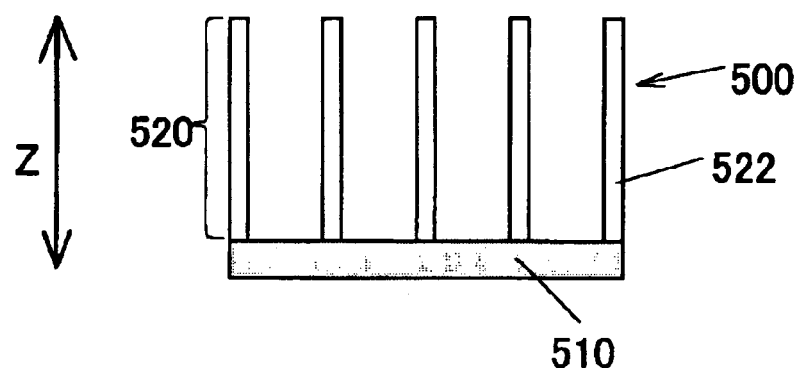
FIG. 18 is a schematic side view of a structure of the conventional heat sink.
Figure 19:
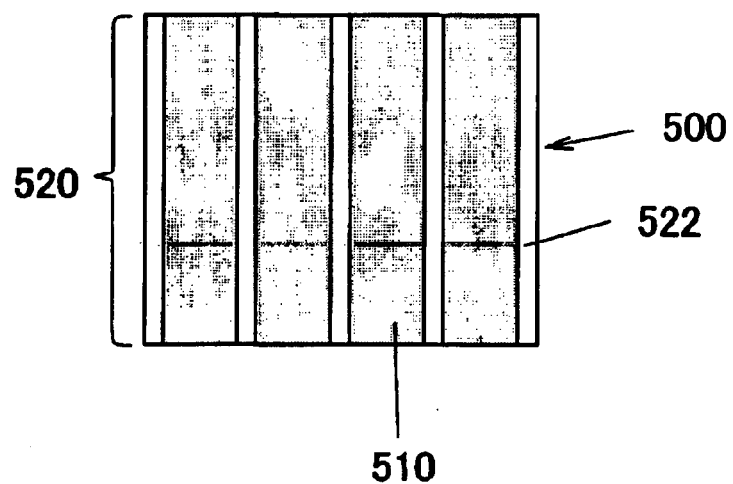
FIG. 19 is a schematic top view of the heat sink shown in FIG. 18.
Figure 20:
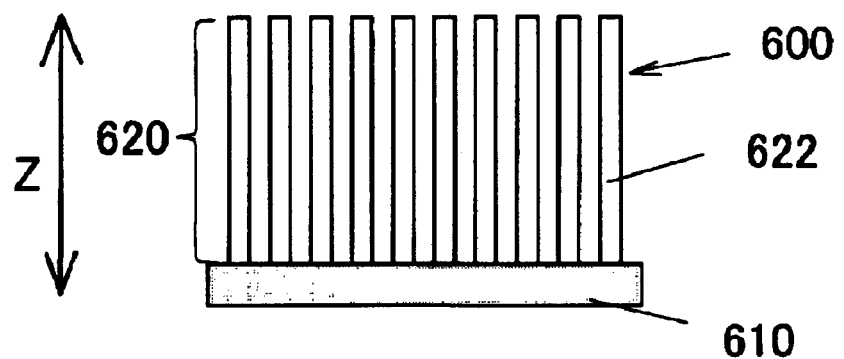
FIG. 20 is a schematic side view of a structure of the conventional heat sink.
Figure 21:
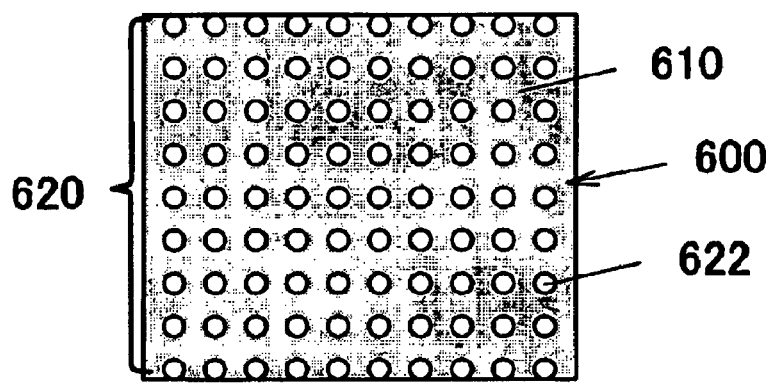
FIG. 21 is a schematic top view of the heat sink shown in FIG. 20.

Referring to FIG. 17, it is apparent that the inventive heat sink 100 has superior heat radiation performance or cooling performance to that of the conventional heat sink 600. Here, FIG. 17 is a view that compares cooling performance of the conventional heat sink 600 with that of the inventive heat sink 100. In FIG. 17, the conventional heat sink is shown like a rhomb, the heat sink 100 shown in FIG. 1 is shown as a triangle, and the heat sink 100 shown in FIG. 12 is shown as a square. The abscissa axis denotes a fin pitch (mm), while the ordinate axis denotes the cooling performance (W). The inventive fin pitch is an interval between adjacent pillar parts. As understood from FIG. 17, the inventive heat sink 100 has superior cooling performance to that of the conventional heat sink 600. A large fin pitch value slightly drops the cooling performance, whereas the conventional heat sink 600 remarkably lowers cooling performance with fin pitch. In other words, the enlarged fin pitch in the conventional heat sink 600 would lead to a smaller heat radiation area and clearly lower the cooling performance. It is understood that the present invention maintains the heat radiation area at the thin plates 132 and side plate 170, and the enlarged interval between pillar parts 120 do not lower the cooling performance so much.

Turning back to FIG. 1, a description will be given of the PC 300 to which the inventive heat sink 100 is applicable. The PC 300 has a housing (not shown), and accommodates the motherboard 200 and a hard disc drive ("HDD") and floppy disc drive ("FDD") (not shown). The instant embodiment uses the desktop PC, but the PC 300 may be a tower type. The PC 300 includes a display as an output part (not shown), and a keyboard and mouse as an input part (not shown). The display, keyboard, and mouse may use any technology known in the art, and a detailed description will be omitted in this specification.

The motherboard 200 typically includes a socket (not shown) for attaching the CPU 210 and a memory, and an expansion slot to which an expansion card is attached. Each part may be electrically connected by attaching the CPU 210 as a control part and a memory (not shown) as a main storage to the motherboard 200. The socket for attaching the CPU 210 covers both a socket and a slot, and a shape of the socket is not limited. Similarly, a shape of the socket for the memory is not limited.

The motherboard 200 mounted with the CPU 210 has the heat sink 100 on the CPU 210 at the side opposite to the motherboard 200. The heat sink 100 surface-contacts the CPU 210 through the heat receiving surface 12 of the heat receiving part 110. The heat sink 100 and the CPU 210 are fixed together by a clip (not shown). This clip holds the heat receiving part 110 and the CPU 210 using as the vent 128 of the pillar part 120 for a perforation of the clip. The heat sink 100 may use any structure that has been discussed above, and a detailed description will be omitted. The fan 150 may be provided, as shown in FIG. 16, to the heat sink 100 at the side opposite to the CPU 210 so as to enhance the heat radiation efficiency. Whether the fan 150 is provided is optional and determined by the intended cooling performance. The fan 150 may use a type that blows up the air from the side of the heat receiving part 110 to the side of the radiating part 130, or a type that blows up the air from the radiating part 130 to the heat receiving part 110.

The PC has a HDD and FDD as an auxiliary storage. The HDD is a unit that moves an arm on a disc to which a magnetic material is attached for reading and writing. The HDD and FDD may use any technology known in the art, and a description thereof will be omitted.

In operation, a user of the desktop PC 300 executes a program stored in the HDD manipulating the keyboard and/or mouse. The CPU 210 downloads necessary data from the HDD and the ROM (not shown) to the memory. The heat generated from the CPU 210 transfers to the radiating part 130 of the heat sink 110 through the heat receiving part 110 and the pillar part 120. As a result, the heat is radiated from surfaces of the thin plate 132 and side plate 170 of the radiating part 130 (air cooling). Of course, the heat is radiated from the radiating surface 114 of the heat receiving part 110 and the pillar part 120 due to the heat conduction associated with the air convection. Blast from the fan 150 shown in FIG. 16 would compulsorily cool the radiating part 130.

Further, the present invention is not limited to these preferred embodiments, and a various variations and modifications may be made without departing from the spirit and scope of the present invention. If required, the side plate 170 and other members may include a hollow bottom portion having the bottom surface 124, in which cooling water or other refrigerants (e.g., fleon, alcohol, ammonia, galden, and flon) are contained to form a heat pipe plate. In addition, the side plate 170 and other members, if necessary, may be connected with an external heat pipe, or the like. This heat pipe may include a pipe with a difference of elevation made of aluminum, stainless, copper, or the like. The pipe has a wick material made of glass fiber, reticular thin copper wire, or the like affixed inside, and under reduced pressure, stores cooling water or other refrigerants. The cooling water cools exoergic components by repeating the following cycle: having obtained heat from the exoergic components in a lower position, the cooling water is vaporized and moves up to a higher position, and then is spontaneously or forcefully cooled in the higher position, liquefied, and returns to the lower position. The heat pipe when connected to a specific exoergic source would cool the source efficiently or intensively.

The inventive heat sink spaces the heat receiving part from the radiating part by a certain height, and allows air inflow to the radiating part in this height. A structure that provide a weight approximately below the head with respect to the balancer section, and a structure that bends and spaces the balancer section from the disc may mechanically stabilize the weight balance of the balancer section, and effectively reduce the torsion. Moreover, use of the preamp IC for the weight would be able to improve the electric characteristics. Even when the thin plate provided on the radiating part reduces the number of pillar parts, a sufficient heat radiating area may be maintained and the heat radiating efficiency may be enhanced in comparison with the conventional one. When the thin plate is bent to form a corrugated shape and/or to form a narrow bending interval, the surface area and consequently the heat radiation area may increase. The raised pieces on the thin plate may disturb the airflow, and promote the convection at the radiating part. The increased number of the pillar parts and a shape of the pillar part may promote the air convection and improve the heat radiation efficiency.

What is claimed is:

1. A heat sink comprising:

a heat receiving part for receiving heat from the outside;

a first radiating part, connected to said heat receiving part, which forms a first air channel, and radiates the heat from said heat receiving part using air that passes through the first air channel; and a second radiating part, located apart from said heat receiving part and connected to said first radiating part, said second radiating part forming a second air channel which the air that has passed the first air channel enters, the second air channel being narrower than the first air channel, said second radiating part radiating the heat from said first radiating part, and being larger than said heat receiving part.

2. A heat sink according to claim 1, wherein said first radiating part includes plural fins, and said second radiating part is provided between two fins.

3. A heat sink according to claim 1, wherein said first radiating part has a first fin, and said second radiating part has a second fin thinner than the first fin.

4. A heat sink according to claim 1, wherein said second radiating part has a larger surface area than said first radiating part.

5. A heat sink according to claim 1, further comprising a side plate that encloses said second radiating part and defines an air channel.

6. A heat sink according to claim 1, wherein said second radiating part includes:

a first part located at a position corresponding to a center of the heat receiving part; and a second part, located outside the first part, which has a larger surface area than the first part.

7. A heat sink according to claim 1, wherein said second radiating part includes:

a first part located at a position corresponding to a center of the heat receiving part; and a second part, located outside the first part, which has a longer than the first part in a height direction.

8. A heat sink according to claim 7, wherein the height of the second air channel nearest the first part is smaller than the height of the second air channel nearest the second part.

9. A heat sink according to claim 1, wherein said second radiating part includes a projection that disturbs airflow in the second air channel.

10. A heat sink according to claim 1, wherein said second radiating part includes a notch that assists inflow of the air.

11. A heat sink according to claim 1, wherein said first radiating part becomes wider with distance from said heat receiving part.

12. A heat sink according to claim 1, wherein said first radiating part has a fin with a notch connected to the first air channel.

13. A heat sink according to claim 1, wherein said first radiating part has plural fins, which have a slit connected to the first air channel between adjacent fins.

14. An electronic apparatus comprising:

a printed board mounted with an exoergic component; and a heat sink, provided on said printed board, which cools the exoergic component, wherein said heat sink includes:

a heat receiving part for receiving heat from the outside;

a first radiating part, connected to said heat receiving part, which forms a first air channel, and radiates the heat from said heat receiving part using air that passes through the first air channel; and a second radiating part, located apart from said heat receiving part and connected to said first radiating part, said second radiating part forming a second air channel which the air that has passed the first air channel enters, the second air channel being narrower than the first air channel, said second radiating part radiating the heat from said first radiating part.

15. A heat sink comprising:

a heat receiving part for receiving heat from the outside;

a first radiating part, connected to said heat receiving part, which forms a first air channel, and radiates the heat from said heat receiving part using air that passes through the first air channel; and a second radiating part, located apart from said heat receiving part and channel which the air that has passed the first air channel enters, the second air channel being narrower than the first air channel, said second radiating part radiating the heat from said first radiating part, wherein said first radiating part has a radiating area that widens in a direction from said heat receiving part to said second radiating part.

16. A heat sink according to claim 15, wherein said first radiating part forms only the first air channel that extends in one direction, and the first air channel has a sectional area that maintained constant from said heat receiving part to said second radiating part.

* * * * *

UNITED STATES PATENT AND TRADEMARK OFFICE
CERTIFICATE OF CORRECTION

PATENT NO.    : 6,826,050 B2
DATED         : November 30, 2004
INVENTOR(S)   : Masumi Suzuki et al.

It is certified that error appears in the above-identified patent and that said Letters Patent is hereby corrected as shown below:

Title page,
Item [22], PCT Filing Date, should read -- Dec. 27, 2000 --.

Signed and Sealed this

Thirteenth Day of September, 2005

JON W. DUDAS
*Director of the United States Patent and Trademark Office*